United States Patent
Asprey

[19]

[11] Patent Number: 6,150,997
[45] Date of Patent: Nov. 21, 2000

[54] VIDEO TRANSMISSION SYSTEM

[75] Inventor: Robert R. Asprey, Harvest, Ala.

[73] Assignee: Cybex Computer Products Corporation, Huntsville, Ala.

[21] Appl. No.: 08/741,697

[22] Filed: Oct. 31, 1996

Related U.S. Application Data

[63] Continuation-in-part of application No. 08/177,442, Jan. 4, 1994, abandoned, which is a continuation-in-part of application No. 07/912,689, Jul. 13, 1992, Pat. No. 5,276,404, and a continuation-in-part of application No. 08/219,979, Mar. 29, 1994, Pat. No. 5,576,723, and application No. 08/660,076, Jun. 3, 1996.

[51] Int. Cl.$^7$ .................................................. G09G 5/00
[52] U.S. Cl. .................................... 345/2; 345/204
[58] Field of Search .................... 345/1, 2, 204, 345/213, 150

[56] References Cited

U.S. PATENT DOCUMENTS

| | | |
|---|---|---|
| 3,613,078 | 10/1971 | Manning et al. ............... 714/800 |
| 3,623,067 | 11/1971 | Deal, Jr. et al. ............... 345/2 |
| 3,750,137 | 7/1973 | Wong et al. .................. 340/330 |
| 3,774,158 | 11/1973 | Clark . |
| 5,029,111 | 7/1991 | Mansell ....................... 395/510 |
| 5,117,225 | 5/1992 | Wang .......................... 345/2 |
| 5,245,327 | 9/1993 | Pleva et al. .................. 345/147 |
| 5,268,676 | 12/1993 | Asprey et al. ................. 345/2 |
| 5,299,306 | 3/1994 | Asprey ........................ 375/257 |
| 5,576,723 | 11/1996 | Asprey ........................ 345/2 |

*Primary Examiner*—Bipin Shalwala
*Assistant Examiner*—Kent Chang
*Attorney, Agent, or Firm*—Nixon & Vanderhye P.C.

[57] ABSTRACT

A non-inverting amplifier powered by a single polarity of electrical power with respect to a ground potential. Three of these amplifiers, one for each of the three basic colors, feeds three in-line adjacent conductors of a multi-conductor cable and wherein a signal to the center of these conductors is inverted. At the output end of the cable, the originally inverted signal is again inverted, after which all signals are fed to a monitor.

2 Claims, 5 Drawing Sheets

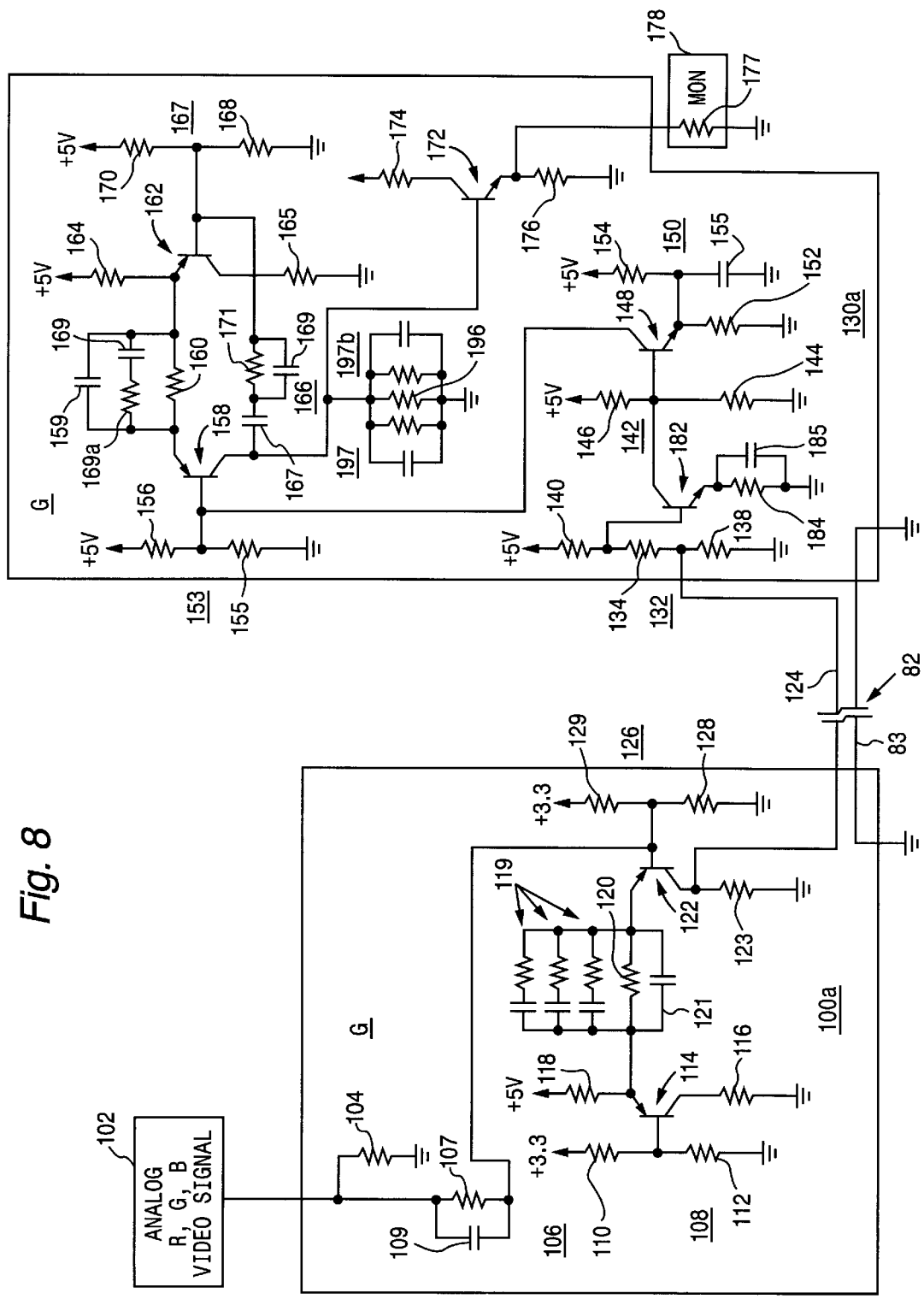

6,150,997

VIDEO TRANSMISSION SYSTEM

CROSS REFERENCE OF RELATED APPLICATIONS

This application is a continuation in part of application Ser. No. 08/177,442, filed on Jan. 4, 1994, now abandoned; which is a continuation-in-part of application Ser. No. 07/912,689, filed on Jul. 13, 1992, now U.S. Pat. No. 5,276,404. This application is also a continuation in part of application Ser. No. 08/219,979, filed Mar. 29, 1994, now U.S. Pat. No. 5,576,723 and application Ser. No. 08/660,076, filed on Jun. 3, 1996.

FIELD OF THE INVENTION

This invention relates generally to color-type computer video systems and particularly to one in which color signals which range in frequency to excess of 30 mHz are transmitted through a generally low frequency multi-conductor cable.

BACKGROUND OF THE INVENTION

There are many occasions where it is necessary to process and transmit color computer video signals. In one such instance, when analog VGA video and keyboard signals are routed between one of a plurality of computers and a single monitor and keyboard by switching equipment, such as the Commander™ module manufactured by Cybex Computer Products Corporation located in Huntsville, Ala., analog VGA video levels routed thereby may be reduced and high frequency components of the signal attenuated by switching circuitry inside the Commander™ module. Further, a problem often occurs as a result of interaction between the color signals.

In another instance, where analog video and other data signals are coupled to or between workstations via relatively long conductors, similar signal losses occur. In order to compensate for these signal losses, it is generally necessary to regenerate voltage amplitude of the video and data signals prior to inputting them to a monitor and other peripheral devices. Typically, such regeneration is done by a pair of transistors coupled in a common emitter configuration, with the first transistor inverting the signal and the second transistor reinverting the signal in order to provide non-inverted voltage amplification. While this type of amplifier requires power of a single polarity and ground, D.C. coupling of the amplifiers is generally difficult to implement and not particularly stable.

Accordingly, it is an object of this invention to provide video circuitry which is simple in construction and which possesses a voltage gain factor sufficient to boost a weak analog video signal to a conventional, usable amplitude.

Additionally, it is an object of this invention to provide a constant current, high frequency enhanced, video transmitter disposed to operate with a single polarity source of D.C. power with respect to ground. As a feature of the invention, the enhancement is achieved by a two-unit amplifier wherein an input of one unit is coupled through a generally like unit of the other unit and wherein coupling between the two units employs at least one reactance path which selectively lessens gain at certain relatively lower frequency ranges to thus relatively provide selected high frequency gain at, at least, one selected range of frequencies.

Further, it is an object of this invention to provide a communications system wherein a transmitter and receiver are located at substantial distances, and wherein an improved video transmitter is employed to feed a transmission line which is terminated by an enhanced video receiver, enabling relatively long cables to be employed between transmitters and receivers.

A further feature of this invention is to provide a computer color signal system wherein red, green, and blue video signals are separately fed to three conductors at the input of a multi-conductor cable and wherein transmitter and receiver circuitry readily enables either like phase or relatively reverse phased signals to be transmitted and selectively processed by a receiver without major changes in circuitry.

BRIEF DESCRIPTION OF THE DRAWINGS

FIG. 8 generally follows the circuitry shown in FIG. 6 except that the circuitry of FIG. 8 includes signal inversion, illustrated in block form in FIG. 7.

FIG. 9 is a partial cross-sectional view of a cable and three conductors of it, each conductor being employed in interconnecting one of three color signals.

DETAILED DESCRIPTION OF THE DRAWINGS

Figure 1:
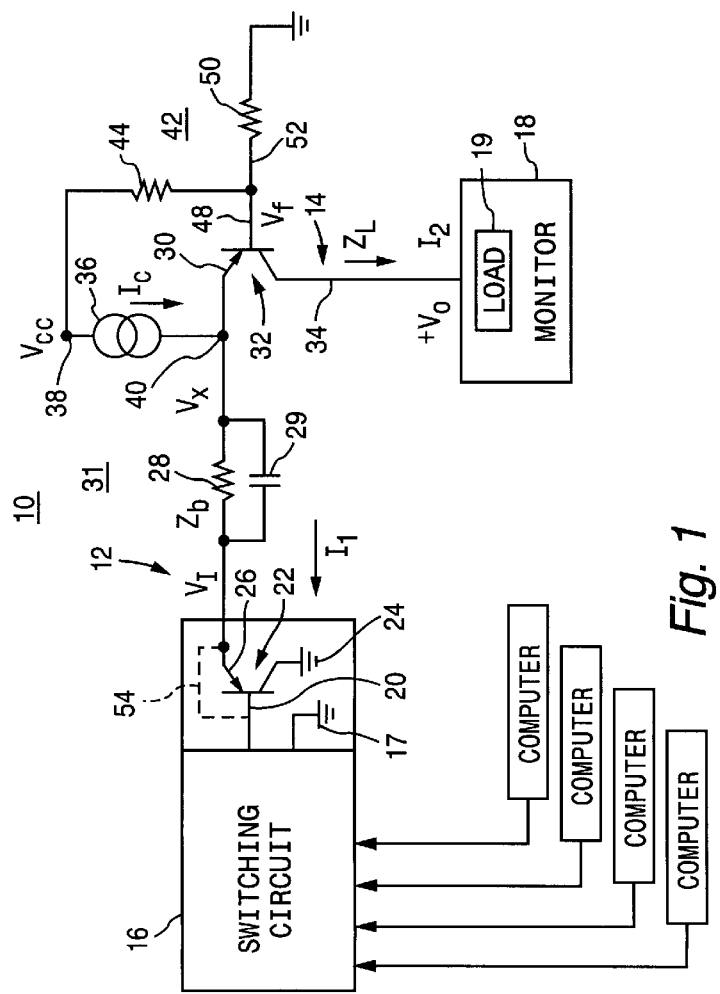
FIG. 1 is a schematic view of an amplifier circuit generally representative of an aspect of the present invention.

Referring initially to FIG. 1, a non-inverting, constant current amplifier 10 is shown having an input region 12 and an output region 14. Input region 12 is particularly coupled to a source 16 of degraded analog video signals (FIG. 4), such as found in the aforementioned Commander™ module, with resultant lowered amplitude and attenuation of high frequency components of the signal. In this embodiment wherein the Commander™ module is used, an output analog video signal is provided by an emitter 26 of a PNP transistor 22 in the Commander™ module. Output region 14 of amplifier 10 is coupled to a load having known characteristics, such as an analog video monitor 18 or other analog device, with amplifier 10 providing a non-inverted, amplified representation of the input signal across the load. Where the output is coupled to a conventional analog VGA computer monitor 18, the monitor represents a load 19, which may be a resistor of about 75 ohms, with the output signal from region 14 across this 75-ohm load being about 700 millivolts. In this instance, it is to be appreciated that there would be a discrete circuitry 10 for each of the discrete video signals which, in the instance of a VGA monitor, include primary red, green, and blue analog signals. While this circuitry in a preferred embodiment is to be implemented with respect to the currently manufactured Commander™ module, it will be apparent to those skilled in the art that numerous other applications exist where non-inverting analog amplification with an enhanced output is required or desired.

Figure 7:
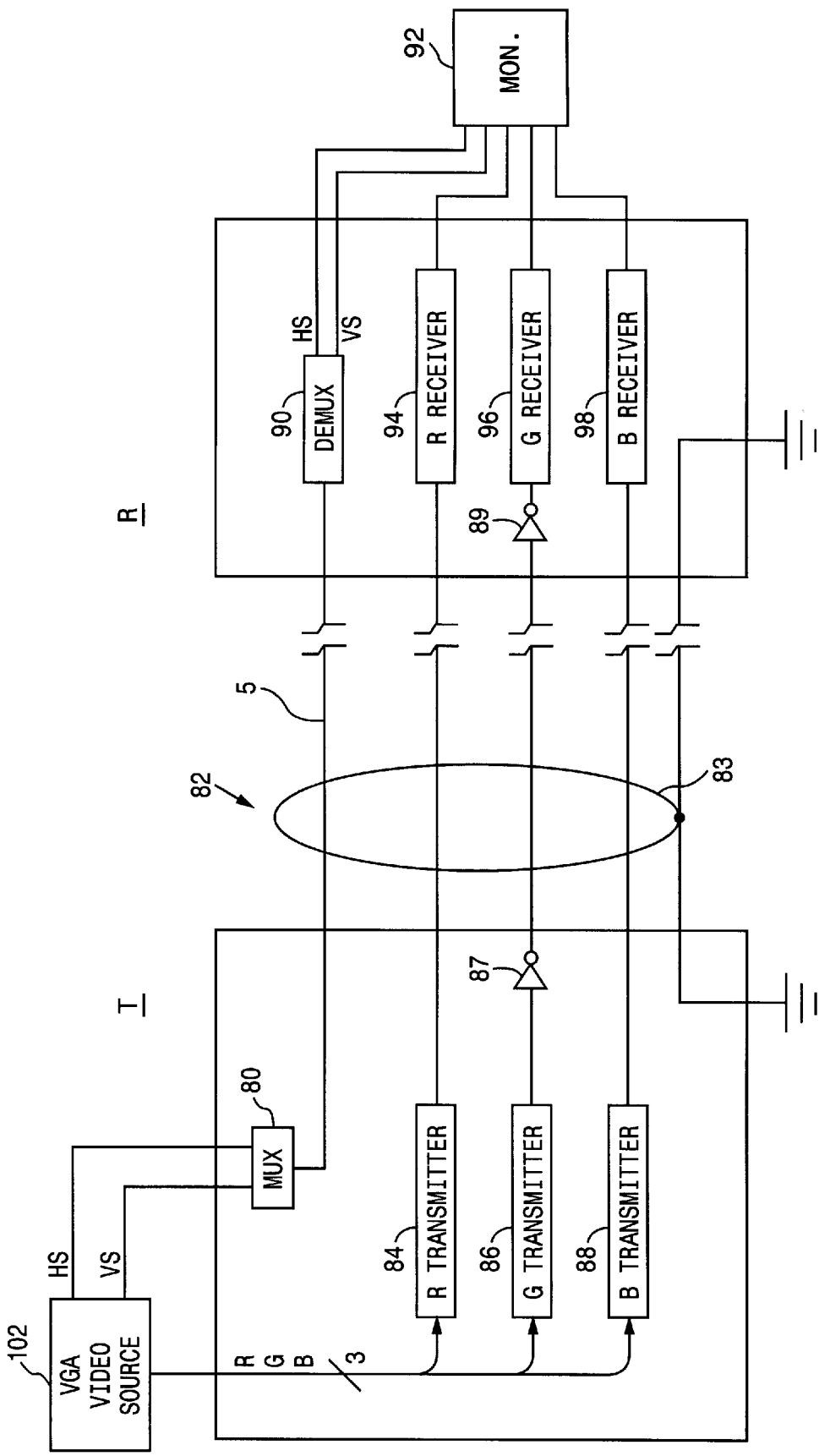
FIG. 7 is a block diagram showing the relationship of three of the systems shown in FIG. 6, it differing by the addition of inverters 87 and 89.
Figure 10:
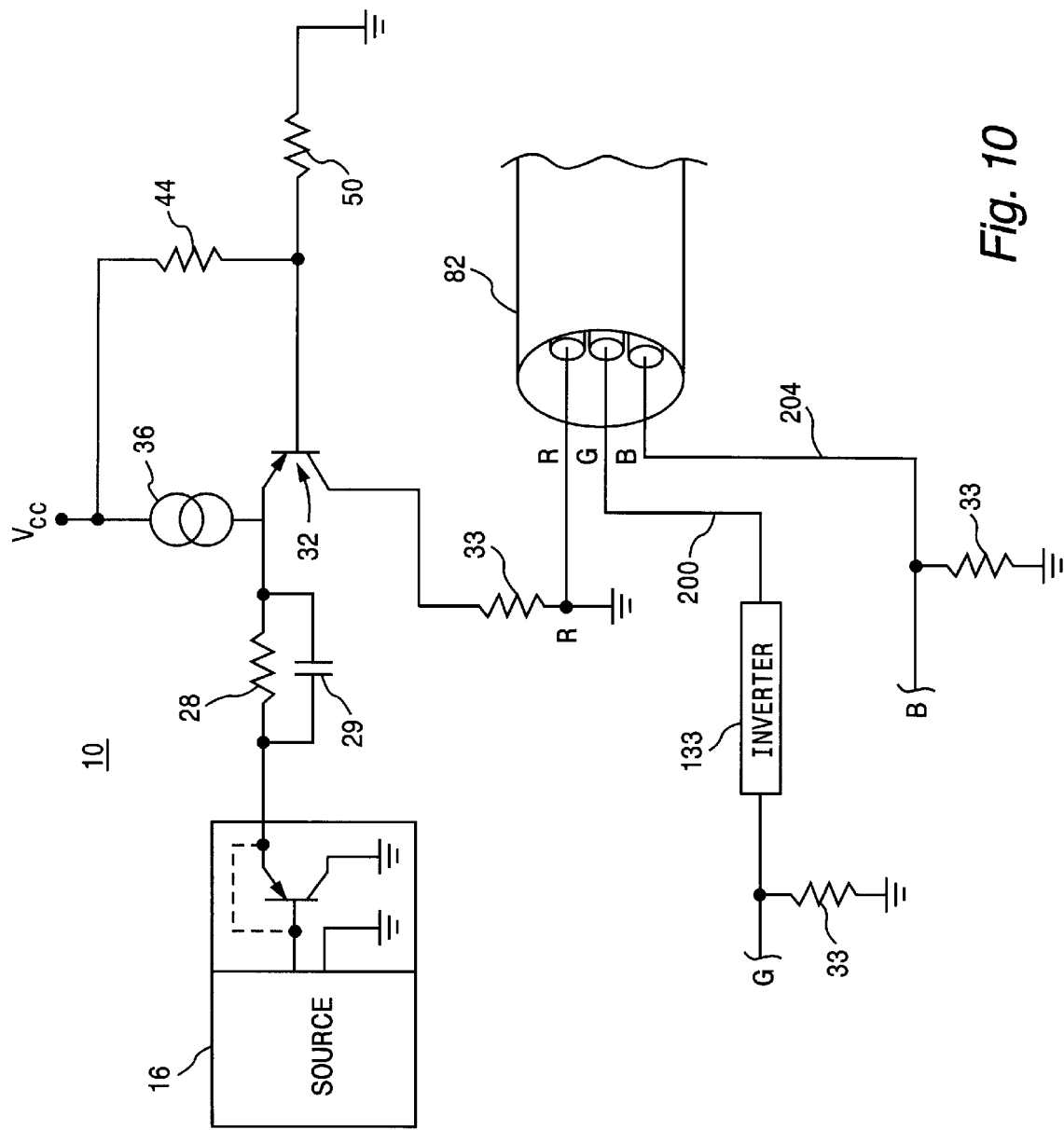
FIG. 10 is a combination schematic-block electrical diagram wherein three of the amplifiers as illustrated in FIG. 1 are employed, one for each of the three color signals used in a color video system, plus showing that one of the amplifier outputs is fed through an inverter.

Network 31, an impedance including a capacitive reactance, as will be described, is coupled from the input emitter 26 of transistor 22 to the emitter of transistor 32. Generally, in the Commander™ module, PNP transistor 22 is coupled in emitter-follower configuration and connected to network 31, with a base 20 of transistor 22 being coupled to a relatively weak analog video input signal. As such, collector 24 of transistor 22 is coupled to ground, providing an alternate current path to ground for the video signal. Resistor 28 of network 31 has a value of about 20 ohms, and capacitor 29 has a value of about 220 pF, network 31 serving to divert current in a direct relationship from the load impedance responsive to positive voltage excursions of the input signal applied to base 20. Impedance 31 may be fixed to provide a generally fixed gain amplifier or one which can provide variable gains and in selected frequency ranges, the impedance including capacitive reactance and this reactance is coupled as shown between emitter 26 and emitter 30 of transistors 22 and 32. It is chosen to approximately equal the combined reactance effects of transistors 27 and 32 and a cable connected to load 19. Collector 34 of transistor 32, as an example, is coupled across a load impedance 33 to the input of a conductor of communications cable 82 as shown in FIGS. 7 and 10. As an example for transistors 22 and 32, one may employ a transistor 2N2907a or equivalent, which is characterized by having a typical current gain of about 200 and is further able to maintain constant emitter voltage for a given base voltage.

Typically, several reactance sets of RC may be employed, the choice being as to number and value for particular frequency ranges to be high frequency boosted, which in turn is a function of transistor effects of transistors 22 and 32 and the length of a cable 82 (FIG. 7)

A constant current source 36, which may be a conventional one, such as a fixed bias transistor, coupled to a stable voltage source, e.g., 4.5 volts, is coupled to terminal 40 between network 31 and emitter 30 and provides a current limited source of about 9.33 milliamps to be divided between network 31 and transistor 32. A voltage divider circuit 42 includes a resistor 44 coupled at one end to the 4.5-volt voltage source at terminal 38 and at an opposite end to terminal 52, also coupled to base 48 of transistor 32. A second resistor 50 is coupled at one end to a ground potential and at an opposite end to junction 52, with values of resistors 44 and 50 selected to provide a potential to base 48 of transistor 32 no lower than a highest anticipated peak input potential of the analog signal at the base of transistor 22, including any D.C. offset that may be present.

In the Commander™ module, it has been found that the analog video signal may be degraded to about 450 millivolts with a positive 150-millivolt D.C. offset. Thus, values of resistors 44 and 50 are selected to provide about 650 millivolts to terminal 52. With the described voltages applied to transistor 32, a lowest input signal at the input diverts current flow from transistor 32 to flow through resistor 28, reducing current flow through transistor 32 and the voltage at terminal 38 to a point where transistor 32 is biased in its operating range just above its cutoff point. As the input signal increases, current flow through resistor 28 decreases, slightly increasing a voltage level at terminal 40, biasing transistor 32 to a more conductive state and resulting in more current flow through transistor 32 and in turn increasing potential 14, for example, monitor 18, in direct relation with the input signal.

In the instance where the signal from source 16 is of lowered amplitude and is attenuated, but possesses sufficient current sourcing capabilities to drive network 31, the analog input signal is the input signal coupled directly to network 31, as represented by dashed line 54. In this configuration, resistors 44 and 50 are selected to provide a voltage at terminal 52 of about 650 millivolts below a highest anticipated peak input potential of the analog signal in order to compensate for elimination of the diode drop of transistor 22. Additionally, an output driver of routing circuit 16 would also be conventionally configured to provide an alternate current path to ground, as illustrated by ground 17. In this instance, when the input signal is at a lower state, current flows from current source 36 through network 31 to ground 17.

While the specific example described above which includes transistor 22 is an application tailored for the Commander™ module wherein the load is resistive in nature, a more generalized representation of the instant invention without transistor 22 may be illustrated where both load and bypass impedances are complex impedances. Theoretically, and assuming a transistor has a high current gain for transistor 32, the impedance of network 31 may be represented as $Z_b$, with the analog signal source voltage represented by $V_i$, which in this instances is coupled directly to network 31 (dashed line 54), and the highest excursion of the analog signal defined by $V_x$. Current through impedance $Z_b$ is represented as $I_1$. The voltage applied to base 48 is represented as $V_f = V_x$ peak−0.650, and, as stated, is selected to be no lower than the highest peak amplitude of the input signal $V_x$ minus the approximately 650-millivolt diode drop of the emitter-base junction of transistor 32. With such voltages applied to transistor 32, the voltage at junction 40 only fluctuates slightly due to the fixed base voltage and the forward biased emitter-base junction of transistor 32, with this slight fluctuation being sufficient to directly vary conductivity of transistor 32 and resultant current flow therethrough with respect to the input signal. This generally constant voltage at junction 40 is represented by $V_x$ (max peak amplitude), with $I_c$ being current from constant current supply 36. The load is represented by $Z_L$, a complex impedance, with current flow through the load represented as $I_2$ and voltage across load $Z_L$ represented as $V_0$. With such designations, voltage across the load is defined by:

$$V_0 = I_2 \times Z_L$$

and the constant current into junction 40 is a sum of the output currents, or:

$$I_c = I_1 + I_2$$

The deflected current through impedance $Z_b$ is defined by:

$$I_1 = V_x - V_1 / Z_b$$

with the inversely proportional flow of current through load $Z_L$ defined by:

$$I_2 x - I_c - I_1 = I_c - V_x - V_1 / Z_b$$

and the voltage across the load defined by:

$$V_O = Z_L I_2 = (I_c - V_x - V_1/Z_b) \times Z_L$$

For a change of input voltage $V_i$, $$VP_O = (I_c - V_x - V_1/Z_b) \times Z_L = (O - (O - V_1)/Z_b) \times Z_L$$

which, when resolved, becomes:

$$VO = V_1/Z_b \times Z_L$$

yielding an A.C. gain of:

$$V_O/V_1 = Z_L/Z_b$$

Thus, it is seen that gain of the amplifier is strictly controlled by load impedance and impedance between the emitters. In the specific example given for the Commander™ module, impedance of load $Z_b$ is about 75 ohms resistive, the magnitude of impedance of network 31 at a D.C. potential is about 20 ohms, and at 30 mHz, is about 0.6 ohms, as given by the generalized circuit analysis in the foregoing and familiar to anyone skilled in the art. Therefore, it is demonstrated that the above-described amplifier of the preferred embodiment possesses frequency sensitive gain which varies from a gain of about 75/20=3.75 ($Z_L$ divided by $Z_b$) at a D.C. level and a gain of about 75/0.6=125 at 30 mHz. For the various embodiments illustrated and described hereinafter, the coupling impedance is first determined and gain calculated by dividing load impedance by the coupling impedance.

Figure 2:
FIG. 2 is a schematic view of an alternate embodiment of a portion of the circuit shown in FIG. 1 which configures the circuit of FIG. 1 as a constant current amplifier in accordance with a feature of this invention.
Figure 3:
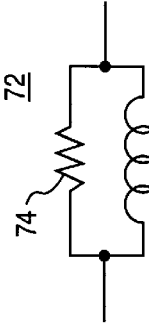
FIG. 3 is a schematic view of an alternate embodiment of a portion of the circuit shown in FIG. 1.

For configuring amplifier 10 to selectively amplify particular frequencies, reference is made to FIGS. 2 and 3. The term "receiver" may refer to both circuitry and monitor as a display, or the term "monitor" may refer to both receiver circuitry and display, as indicated by the context. Here, as shown in FIG. 2, a resistance 64 is substituted for network 31 in FIG. 1. This configures amplifier 10 as a broadband amplifier which has gain independent of frequency as long as the load is frequency independent. FIG. 3 illustrates an LR network 72 including resistor 74 coupled across inductor 76 which, when substituted for network 31, provides an amplifier 10 having a gain inversely proportional to frequency. Alternately, resistor 74 may be coupled in series with inductor 76 (not shown). It is significant to note that in any of the described embodiments, gain of the amplifier is the load impedance divided by the deflection impedance of the monitor.

Figure 4:
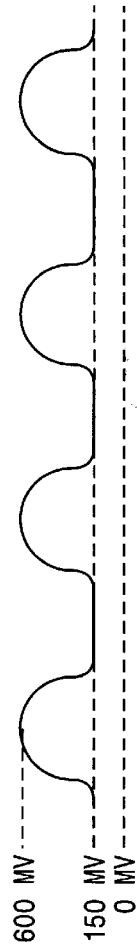
FIG. 4 is an example of an analog video waveform applied to an input region of FIG. 1.
Figure 5:
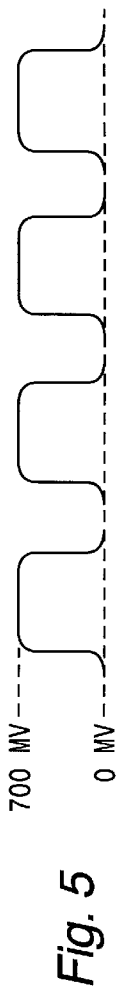
FIG. 5 is an improved output waveform achieved by the invention.

In operation, and referring to FIG. 1, a degraded analog video signal voltage referenced to ground from the Commander™ module taken from one of a plurality of computers and intended to be applied to an analog computer monitor is applied to base 20 of transistor 22. In this instance, bias voltages of transistors 22 and 32 are obtained from terminal 40, with a reference voltage of about 600 millivolts taken from terminal 38 and applied to base 48 of transistor 32. The voltage at terminal 40 is about 1.2 volts, which is a diode drop of about 650 millivolts above the reference voltage applied to base 48, and which is varied as described by transistor 22 responsive to excursions of the input signal applied to base 20. The input signal, as shown in the waveform of FIG. 4, is degraded to the extent of loss of high frequencies necessary and is offset by a positive D.C. bias of about 150 millivolts due to switching levels in the Commander™ module and degraded in amplitude to have a swing of about 450 millivolts between about 150 millivolts and 600 millivolts. This signal, when at the 150-millivolt level and applied to base 20 of transistor 22, biases transistor 22 on, deflecting virtually all the 9.33 milliamps from current source 36 through 20-ohm resistor 28 due to the difference of voltage potentials on either side of resistor 28, with this current being applied to ground via transistor 22. This depletes current flow through transistor 32 and reduces voltage at terminal 40 to just above a cutoff voltage, reducing the IR voltage drop across the monitor load to 0 volts, as seen in the waveform of FIG. 5. As the input signal applied to base 20 rises to about 600 millivolts, transistor 22 is biased toward its cutoff region; and with about 1.2 volts applied to emitter 26 from terminal 40, less current flows through network 31 due to decreasing potential difference across resistor 28. This in turn slightly increases potential at terminal 40 such that transistor 32 is biased more toward a conductive state, resulting in increasing current flow through transistor 32 to the 75-ohm load in monitor 32. As the potential across network 31 equilibrates as transistor 22 is driven toward cutoff, the entire 9.33 milliamps from constant current source 36 is shifted to flow through transistor 32 and the 75-ohm monitor load, increasing the potential across the 75-ohm load to about 700 millivolts, as shown in FIG. 5, a conventional level for an analog monitor.

As described, as the input signal fluctuates between low and high levels, the constant current is divided and fluctuates with the input signal between transistors 22 and 32. In the absence of transistor 22, an analog video signal extending from about 150 millivolts or lower to about 600 millivolts is applied to network 31, and when at the lowest level, draws a highest level of current flow through network 31, which current flow applied to ground 17 reduces potential on emitter 30 to a level to bias transistor 32 to a higher impedance, reducing output on collector 34 to 0 volts. As the signal applied to network 31 increases, less current flows through resistor 28, increasing a potential at terminal 40 and biasing transistor 32 to a more conductive state in direct relationship with the input signal, shifting current flow to the load via transistor 32 and increasing voltage drop thereacross. In the event the input signal exceeds the reference potential applied to terminal 52, as by a noise spike, biasing transistor 32 into saturation, the load is generally protected from an overvoltage condition due to the constant current source 36 providing only 9.33 milliamps current flow to the load.

A particular usage of the video amplifiers as described above is illustrated in FIG. 6 showing one of three, R, G, or B, signal amplifiers employed in a transmission system. Here, a VGA video source, such as, but not limited to, a computer, provides analog VGA video and sync signals (FIG. 7) to a video transmitter and receiver system, each of which has application for amplifiers as generally illustrated in FIG. 1. With respect to transmitter 100 (FIG. 6), power may be provided by the keyboard port of a computer, or, alternately by a power supply $P_1$, which provides +5 volts D.C. to the transmitter portion of the system of FIG. 6. This potential, where it is provided by a computer, may fluctuate for various reasons, and thus is regulated at a potential of 3.3 volts, as shown by $P_1$ in FIG. 6. This prevents any noise or fluctuations from being induced into the video signals. A separate, regulated power supply $P_2$ of FIG. 6 provides +5 volts to the receiver portion of the system, with a common ground 83 being provided between transmitter 100 and receiver 130 via a conductor 83.

Referring to FIG. 7, the video signals R (red), G (green), and B (blue) are each provided to a transmitter circuit 84, 86, and 88, respectively, each of which conditions the respective video signal and applies a conditioned video signal in single ended relation to a conductor of cable 82. For the basic case, inverters 87 and 89 are not employed. The conditioning of the video signals includes reducing the analog video signals from their normal amplitude swing of from 0 to 700 millivolts to a swing of from about 0 to 200 millivolts and further includes shaping of the video signals to counteract distortion and attenuation, high frequency losses, affected by cable 82. These functions are performed by amplifier 10 of FIG. 1 and transmitter 100 of FIG. 6. FIG. 7 also illustrates the handling of the synchronization signals from transmitter T wherein the horizontal (HS) and vertical (VS) signals are multiplexed in multiplexer 80 and transmitted via conductor S of cable 82 to a receiver R.

In the receiver side of the system, the multiplexed signals are applied to a demultiplexer 90 (FIG. 7), which demultiplexes the HS and VS signals and applies the HS and VS signals to monitor 92. Concurrently, the R, G, and B signals are each restored to their original amplitude swing of from 0 to 700 millivolts in each of the R, G, and B receiver circuits 94, 96, and 98, respectively, and applied to monitor 92, as described for receiver 130 in FIGS. 6 and 8.

Figure 6:
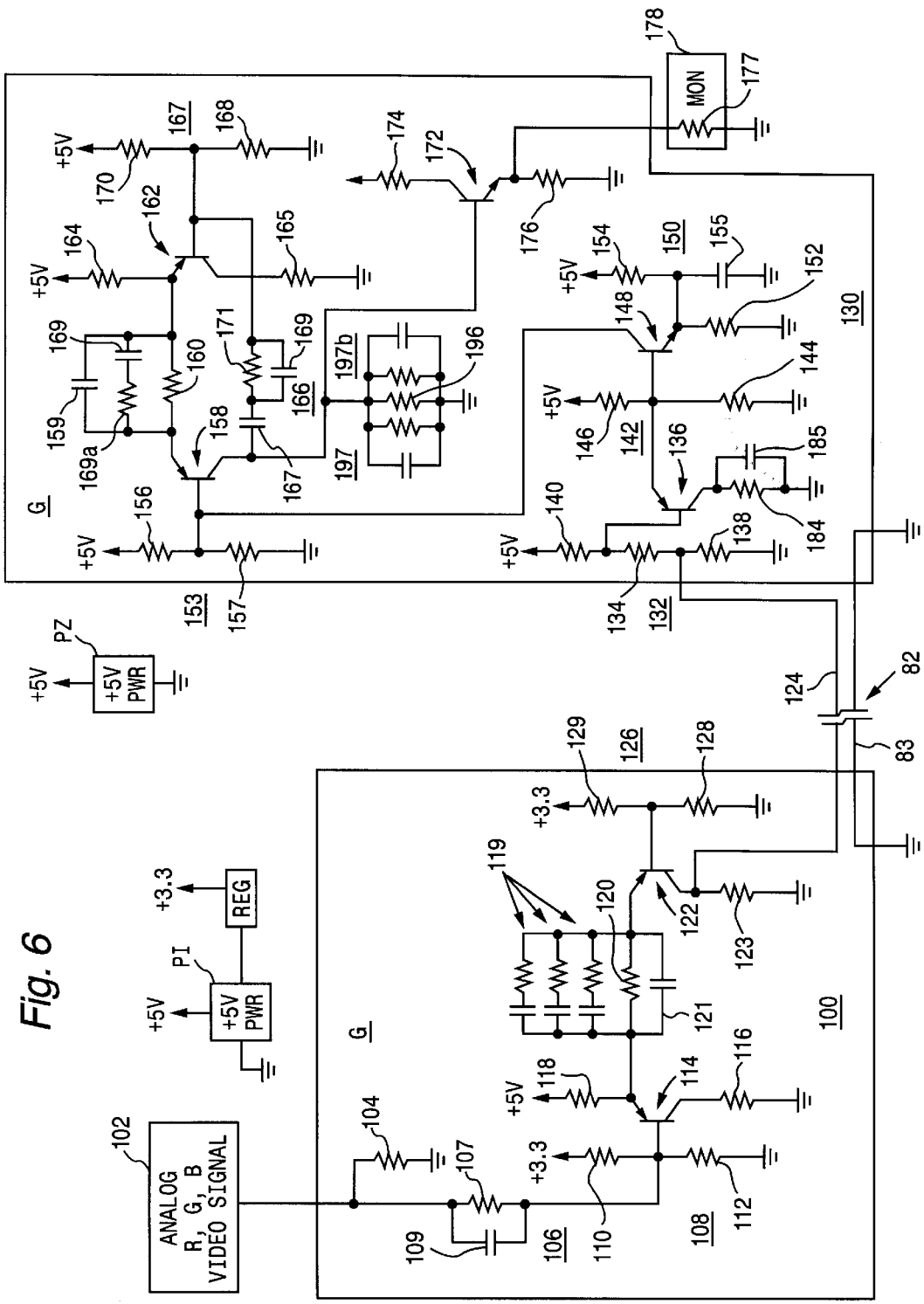
FIG. 6 is an electrical schematic diagram showing one of three transmitter-receiver combinations, FIG. 6 employing both a transmitter and a receiver following the basic circuitry shown in FIG. 1.

Examples of the single ended transmitter and receiver system for the R, G, and B signals, as shown in the schematic diagram of FIGS. 6 and 8, use the basic constant current amplifier as described in the foregoing. In an analog VGA environment, one of these systems is necessary for each of the R, G, and B video signals.

In an improved version, a video signal, the G signal, is inverted to reduce signal interaction and interference, this being illustrated in transmitter 100a and receiver 130a shown in FIG. 8 where video signals are inverted in the transmitter to reduce signal interaction during transmission in cable 82.

Initially, with respect to FIG. 6, at transmitter 100, one of the analog video signals, R, G, or B, is processed. Each has a signal swing of from about 0 to 700 millivolts and is provided from a source 102 and applied across a resistor 104, which may be about 76 ohms and coupled between the signal line and a ground reference potential. Resistor 104 serves to attenuate the video signal and draw a small current flow from the signal line to reduce induced noise. The attenuated signal is then passed across an RC network 106 constructed of a resistor 107 which may be about 509 ohms and a capacitor 109 which may be about 68 pF, which network 106 serves to attenuate the video signal to have a signal swing of about 400 millivolts, after which the signal is passed across voltage divider network 108. Network 108 comprises a resistor 110 which may be about 604 ohms and a resistor 112 which may be about 1.62K ohms, with resistor 110 being coupled to a source of regulated 3.3 volt bias power and resistor 112 coupled to the ground reference potential.

This combination of resistors 104, 107, 110, and 112 and networks 106 and 108 form a termination network, yielding an equivalent impedance of about 75 ohms at low frequencies. This network serves to terminate the incoming signal while providing a much higher impedance, in the thousands of ohms range, to the A.C. portion of the signal. Additionally, network 106 provides a voltage offset of about 1.9 volts, so the reduced video signal of 400 millivolts peak-to-peak is superimposed on the 1.9-volt offset with a signal swing of from about 1.7 to 2.1 volts peak to peak. This signal is applied to the base of a PNP transistor 114 (FIG. 6), which has a collector coupled to the ground reference potential via resistor 116 which may be about 29.4 ohms. The emitter of transistor 114 is coupled to the +5-volt source via resistor 118 which may be about 140 ohms, which resistor provides a source of constant current. Additionally coupled to the emitter of transistor 114 via shunt resistor 120 is the emitter of a second PNP transistor 122 of an identical type as transistor 114 and which also has a collector coupled to the ground reference potential via a resistor 123 which may be about 59 ohms. Typically, a capacitor 121, which may be about 220 pF, is coupled across resistor 120 to generally pass high frequency components of the video signal, and thus transmitter 100a provides a high frequency enhancement to the signal. In addition, there is shown three series RC networks 119 connected between the emitters of transistors 124 and 122. These elements connected between the emitters of transistors 124 and 122 form a frequency responsive network which functions to increase selective portions of the response of the transmitter, enhancing frequency response.

The base of transistor 122 is coupled to D.C., being a midpoint of a voltage divider network 126, which is constructed of resistor 128, which may be about 5.9K ohms and coupled to the reference ground potential, and resistor 129, which may be of about 590 ohms and coupled to the 3.3-volt bias power source. Network 126 provides a fixed reference potential of about 1.65 volts to the base of transistor 122, this potential being about 0.35 volts less than the potential provided by voltage divider network 108 for providing a slight imbalance in the biasing of transistors 114 and 122 which generates a current flow through resistor 120 and transistor 122 with no applied signal to transistor 114. In the transmitter, transistor signal losses are compensated by RC circuit 106. Thus, the circuitry just described is reactance coupled with there being complementary current flows to the emitter of the two transistors, thus achieving the constant current desired effect.

The output of transmitter 100 (FIG. 6) is taken from the collector of transistor 122 and applied to one conductor 124 of cable 82. Cable 82 is a multi-conductor cable having a number of insulated parallel conductors and an outer shield, metal portion, which effects the conduction of a signal ground and shielding in general. The other two video signals are processed by similar circuitry and in a like manner applied to discrete conductors of cable 82. The ground connection between transmitter 100 and receiver 130 is effected by the outer conductive sheath 83.

Conductor 124 (FIG. 6) couples from across 59-ohm resistor 123 of the transmitter with this as an approximate value of the characteristic impedance of conductor 124, and wherein the video signal has about a 200-millivolt swing centered about an offset potential of about 0.5 volts. Cable 82 (FIG. 6) has conductor 124 and other like conductors, and, in the example shown, is of a type such as Belden 9936, a 15-conductor, low capacitance shielded cable which, in accordance with this invention, has been employed to transmit video signals up to 1,500 feet, a somewhat remarkable feat.

The video signal from conductor 124 (FIG. 6) is connected to a receiver 130, with the video signal from conductor 124 being first applied across a voltage divider network 132. Network 132 is constructed of a resistor 134 which may be about 64.9 ohms and coupled to the base of a transistor 136, a resistor 138 which may be about 64.9 ohms and coupled to ground reference potential, and a third resistor 140, which may be about 523 ohms, it being coupled to the base of transistor 136 and to the +5-volt bias potential. Resistors 134, 138, and 140, in combination, provide line termination at the receiver side of conductor 124 at about 59 ohms, the characteristic impedance of conductor 124, and additionally provide a voltage offset of about 1.0 volt to the video signal at the midpoint between resistors 134 and 140.

At the midpoint of resistors 134 and 138, the offset is 500 millivolts, insuring that there is no steady state current flow present in conductor 124. As such, and as the amplitude and high frequency components of video signal are attenuated by the extended length of conductor 124, which, as stated may be any length up to about 1,500 feet, the video signal applied to divider network 132 may swing about 200 millivolts peak to peak for a shorter conductor of about 50 feet and about 190 millivolts peak to peak for a longer conductor of about 600 feet. The attenuated signal is superimposed on the 1.0-volt offset provided by resistor 140 and the combined resistances of resistors 134 and 138 and is applied to the base of transistor 136.

The collector of transistor 136 is coupled to the ground reference potential, and the emitter is coupled to voltage divider network 142. Network 142 is constructed of a resistor 144 which may be about 590 ohms and coupled to the ground reference potential, and a resistor 146 which may be about 806 ohms and coupled to the +5-volt power source, this network providing an increased offset potential of about 2.1 volts to the attenuated video signal. Coupled as described, transistor 136 is connected in emitter-follower configuration so that there is approximately unity gain in this stage, with the offset potential of 1.0 volt being increased to swing from about 1.9 volts to about 2.1 volts. This signal is applied to the base of an inverting and amplifying stage including NPN transistor 148, which has an emitter coupled to a voltage divider network 150 constructed of a resistor 152 which may be about 205 ohms and coupled to the ground reference potential, and a resistor 154 which may be about 3.57K ohms and coupled to +5 volts bias power. Network 150 maintains a constant voltage of about 270 millivolts on the emitter of transistor 148. A capacitor 155, which may be about 180 pF, is coupled across resistor 152 and restores high frequency portions of the signal lost by transistor 148.

The collector of transistor 148 is coupled to the midpoint of a voltage divider network 153 constructed of resistor 157 which may be about 4.99K ohms and coupled to the ground reference potential, and resistor 156 which may be about 511 ohms and coupled to the 5-volt bias potential. The values of resistances of divider network 153 are selected to increase the midpoint of the video signal to about 2.8 volts, biasing transistor 148 into its operating region and providing gain of about 1.9, which boosts signal swing of the video signal to about 375 millivolts. Additionally, the NPN junction of transistor 148 provides temperature compensation for the preceding PNP junction of transistor 136.

The collector of transistor 148 is coupled to the base of a PNP transistor 158 to effect a second phase inversion to that effected by transistor 148. With two amplifying stages, including transistors 148 and 158, amplification of the video signal is divided between these stages so as not to overdrive either of transistors 148 and 158. The emitter of this transistor is coupled via a resistor 160 which may be about 82.5 ohms and a parallel capacitor 159 which may be about 56 pF to the emitter of a PNP transistor 162. Capacitor 159 decreases the reactance between emitters at higher frequencies. One or more RC circuits, as represented by a discrete combination of a resistor 169a and a capacitor 169, may be employed between emitters to provide selective emphasis for different ranges of high frequencies as needed to offset high frequency losses as a function of the length of cable 124. The emitters of these transistors are coupled to the +5-volt source of bias potential via resistor 164 which may be about 82.5 ohms. Resistor 164, like resistor 118 in transmitter 100, provides a constant current from the +5-volt bias potential by virtue of a differential drive appearing at the emitters of transistors 158 and 162, which are complementary as to the magnitude of current flow. The collector of transistor 162 is coupled to ground reference potential via a resistor 165 which may be about 195 ohms; and the base of transistor 162 is coupled to the midpoint of a voltage divider network 167, which is constructed of resistor 168, which may be about 1K ohms and coupled to the ground reference potential and resistor 170, which may be about 464 ohms and coupled to the 5-volt bias potential. This network 166 provides a voltage reference to the base of transistor 162 of about 3.4 volts, which is higher by about 0.6 volts than the offset of about 2.8 volts provided by network 153 to transistor 158. As with transistors 114 and 122 in transmitter 100, this provides an imbalance in the biasing of transistors 158 and 162, causing current to flow through resistor 160 and transistor 158 with no applied signal to transistor 158 of a discrete value. Conductivity is maintained essentially constant by the decrease in one transistor current path and increase by a like quantity in the other transistor as set forth above. An inverse feedback network 166 is coupled between the collector of transistor 158 and base of transistor 112. It consists of capacitor 167, e.g., 100 pF, and a parallel RC circuit consisting of resistor 171 and capacitor 169, resistor 171 being of approximately 100K ohms, and capacitor 169 being of approximately 30 pF. This feedback loop functions to speed up rise times and sharpen edges.

The video signal, which is taken from the collector of transistor 158, has been inverted and amplified by a gain of about 1.9 to have a signal swing of about 700 millivolts, is applied across a resistor 196, which may be about 100 ohms, and is applied to the base of an NPN buffer transistor 172. With respect to RC networks 197 and 197b, one or more are connected between the collector of transistor 158 and ground as needed to accomplish suppression of overshoot when a short cable is used. The resistors of the RC networks 197 and 196b are approximately 80 to 500 ohms, and the capacitors of these networks are approximately 10 to 1,000 pF.

Transistor 172 has a collector coupled via a short circuit protection resistor 174, which may be about 33 ohms to bias power. The emitter of transistor 172 is connected across resistor 176 to ground, this resistor having a resistance of approximately 1K ohms. The output of amplifier 130 is taken across resistor 176 and applied to a load resistor 177 of about 75 ohms in a receiver, an example being monitor 178.

Transistor losses in receiver 130 are in part compensated by the RC network formed by resistor 152 and capacitor 155 and the reactive network 166 which includes a serial path made up of capacitor 167 and resistor 171 plus a capacitor 169 across resistor 171. This reactive network is coupled between the base of transistor 162 and collector of transistor 158.

In operation of the embodiment just described, each of the R, G, and B analog VGA video signals are applied to a transmitter 100 as shown in FIG. 6, it being applied from a source 102 across resistor 104 and network 106, which attenuates swing of video signals to about 400 millivolts peak to peak. The attenuated video signal is then provided to the base of transistor 114 together with a voltage offset of about 2.6 volts from divider network 108. As such, when the video signal is in the upper region of its swing, transistor 114 is biased to a less conductive state, causing a voltage rise to develop on the emitter of transistor 114. In turn, this causes more current to flow through resistor 120 and develops a voltage increase at the emitter of transistor 122. This biases transistor 122 to a more conductive state, increasing current flow therethrough and developing an increased voltage drop across resistor 123, with this voltage being applied to conductor 124.

With a decrease in the signal swing applied to the base of transistor 114, transistor 114 is biased to a more conductive state, causing more current to flow therethrough, lowering the voltage at the emitter of transistor 114. This reduces the voltage drop across resistor 120 and causes a smaller potential to develop at the emitter of transistor 122, biasing it to a less conductive state. This in turn causes the voltage at the emitter of transistor 122 to fall, reducing the signal level applied to conductor 124. Thus, there is no reversal of the phase by transmitter 100 of the input signal, for example, the R signal.

At receiver 130, the attenuated video signal from conductor 124 is applied to network 132, which provides a 1.0-volt offset to the signal, which is passed via resistor 134 to the base of transistor 136. Here, a rise of the potential of the video signal biases transistor 136 to a less conductive state, allowing a corresponding increase of potential to develop at the emitter. This increase, which is superimposed on the 2.0-volt offset provided by network 142, is applied to the base of transistor 148, biasing it to a more conductive state and allowing proportionally more current to flow therethrough due to selection of the bias voltages applied to the base and emitter of transistor 148. This in turn proportionally reduces the potential at the collector of transistor 148, effecting inversion and amplification of the video signal. The lowered potential at the collector of transistor 148 is applied to the base of transistor 158, biasing transistor 158 to a more conductive state, increasing current flow therethrough, which effects amplification and inversion of the video signal. At transistor 162, the increased current flow through transistor 158 causes a corresponding reduced current flow through transistor 162 by lowering the potential applied to the emitter of transistor 162, keeping current provided by resistor 164 constant. The increased current flow through transistor 158 develops a higher potential applied to the base of buffer transistor 172, biasing it to a more conductive state and allowing more current to flow therethrough. This increased current flow develops a higher voltage drop across resistor 176, which is applied to the appropriate video signal input of monitor 178.

With a decrease of signal voltage applied to network 132 from conductor 124, this decrease is felt at the base of transistor 136, biasing it to a more conductive state, which allows a lower potential to develop at the base of transistor 148. This biases transistor 148 to a less conductive state, allowing less current to flow therethrough, increasing the potential at the base of transistor 158. This biases transistor 158 to a less conductive state, decreasing current floe therethrough and causing an increased potential to be felt at the emitter of transistor 162, biasing it to a correspondingly more conductive state. The decreased current flow through transistor 158 causes a lower potential to develop at the base of transistor 172, biasing it to a less conductive state and allowing a lower potential to develop across resistor 176, which is applied to the signal input of monitor 178.

It has been found that a problem may exist, particularly where multi-color signals are transmitted over a cable of the type described above. The length of transmission is extended significantly, a few hundred feet and upward. It is that there is the tendency for some unwanted cross-coupling of signals, and these causing distortions appearing on the visual output of monitor 178 (FIG. 6). Thus, one feature of this invention is to solve this problem. A solution is illustrated in FIGS. 7–10, FIG. 10 illustrating the role in such a system of the amplifier shown in FIG. 1. Thus, it is to be noted that R, G, and B transmitters, each following the circuits of FIG. 1, receive discrete color signals from a VGA source, and their outputs appearing on output resistors 33. As shown, the one carrying the green signal has in series with it an inverter 133 (FIG. 10) and inverter 87 (FIG. 7.) which invert the green signal before providing it to the center conductor of cable 82. Like amplifiers for the red and blue signals are connected to R and B conductors on either side of the G conductor of cable 82, and no inversion is effected.

FIG. 7 shows a complete system employing transmitters 84, 86, and 88 and receivers 90, 94, and 96, each having circuits generally following those of FIG. 1. The transmitter T shows ar inverter 87 in circuit with the green signal, and the receives circuit R includes a second inverter 89 in series with the green signal. Thus, there are related signals which include inversion of one signal by the transmitter and reinversion by the receiver to restore the signal polarity or phase relationships of the signals before they are provided to monitor 92 or 178.

Further, and referring to FIG. 7, it is to be noted that the synchronization signals, horizontal synchronization signal HS and vertical synchronization signal VS, are fed to a multiplexer 30 which time multiplexes these signals and transmits them through another conductor of cable 82 to the R receiver where signals are demultiplexed by demultiplexer 90, and the horizontal and vertical synchronization signals are converted back to separate signals and applied to monitor 92.

FIG. 8 illustrates a modification of FIG. 6 wherein the transmitter and receiver embody phase reversals in the green signal as illustrated in FIG. 7, first the reversal in transmitter 10*a* and the reinversion in receiver 130*a*. FIG. 8 corresponds with amplifier 100 of FIG. 6 with the exception that in FIG. 8, the source 102, instead of being supplied to the base of transistor 114 of amplifier 10*a*, is applied across resistor 104 of transmitter 100*a*, and networks 106 and 108 are then applied to the base of transistor 122. Thus, transistor 122 effects a signal inversion on collector output resistor 123. Alternately, the output of transistor 114, appearing across resistor 116, may be employed as an inverting output. Further, transistor 122 and transistor 114 are selected to be of a higher speed than required by FIG. 6. Such eliminates any phase shift that may occur due to inversion of the G video signal in transmitter 100*a*. Otherwise, circuit operation of transmitter 100*a* follows that of transmitter 100 of FIG. 6.

As the G video signal is inverted, it is necessary to effect an extra inversion of the G video signal. This is done as shown in FIG. 8 where PNP emitter-follower transistor 136 (FIG. 6) is replaced by an NPN transistor 182 (FIG. 8). Here, the base of transistor 182 is coupled to divider network 132 as discussed in the foregoing, with the collector of transistor 182 being coupled to network 142, also as discussed in the foregoing. The emitter of transistor 182 (FIG. 8) is coupled to the ground reference potential via a resistor 184, which may be about 300 ohms, and by capacitor 186. Coupled as described, transistor 182 forms an inverting stage that reinverts the inverted video signal from conductor 124 back to its original relative polarity. It is then coupled to the base of transistor 148 and the following circuitry, this following circuitry being identical in structure and operation to that shown by FIG. 6 except for the polarity of the output signal. In FIG. 8, the signal applied across emitter-resistor 176 (for the G signal) and fed to monitor 178 is, by virtue of the double inversion described, identical in phase with the signals applied to monitor 178 by the circuitry shown in FIG. 6 which would be employed for the red and blue signals.

By virtue of the system described, applicant has provided clearly improved technology in the extended length transmission of color video signals employing relatively low-cost cable and yet achieving very high fidelity color signal transmission for extended lengths of cable.

Having thus described my invention and the manner of its use, it is apparent that the invention has provided an improved three-color processing and transmission system which fairly falls within the scope of the following appended claims, wherein I claim:

1. A system for transmission of analog color video signals between a source of said signals and a video monitor, being at spaced locations, comprising:

a plurality of computers, each providing, as a set, said color video signals;

a switch receiving said sets of said color video signals, each with respect to a common reference, from said computers and providing a selected said set of said color video signals as an output;

a signal transmitter at a first location responsive to said output of a set of said color video signals, said transmitter, including an amplifier for each said color video signal of one of said sets for providing a color video signal output and wherein at least a high frequency portion of each said color video signal has been amplified as a direct function of frequency and providing both an inverting and non-inverting signal, available as an output;

a plurality of video transmission circuits, each said circuit having first and second ends, respectively, one circuit for each of said color video signals of one of said sets and each said circuit having an input responsive to an output of said transmitter at said first end, and each said circuit having a responsive signal output at said second end;

a signal receiver at a second location responsive to each of said transmitted signal outputs and color video signal at said second end, including an amplifier for each said color video signal for providing a discrete color video signal with respect to a common reference; and signal means responsive to said receiver for providing each said color signal, each with respect to a common reference, to an analog color video monitor.

2. A system as set forth in claim 1 wherein: said transmission circuits comprise first, second, and third side-by-side conductors, one for each said color, wherein said third conductor is positioned between said first and second conductors and said cable having a common conductor;

first and second signal inverters;

one each of said red color video signal, and said blue color video signal, and said green color video signal being coupled to one end of said first, second, and third conductors at said first end and wherein said signal coupled to said third conductor is coupled through said first signal inverter, and all signals together provide signals representative of a composite image and are transmitted from said first end to said second end; and said signal means is in circuit with said second inverter.

* * * * *